United States Patent
Ueda

(10) Patent No.: US 6,849,539 B2
(45) Date of Patent: Feb. 1, 2005

(54) SEMICONDUCTOR DEVICE AND METHOD OF FABRICATING THE SAME

(75) Inventor: Yasuhiko Ueda, Minato-ku (JP)

(73) Assignees: NEC Corporation, Tokyo (JP); Hitachi, Ltd., Tokyo (JP); NEC Electronics Corporation, Kanagawa (JP)

(*) Notice: Subject to any disclaimer, the term of this patent is extended or adjusted under 35 U.S.C. 154(b) by 8 days.

(21) Appl. No.: 10/124,389

(22) Filed: Apr. 18, 2002

(65) Prior Publication Data

US 2002/0155699 A1 Oct. 24, 2002

(30) Foreign Application Priority Data

Apr. 23, 2001 (JP) ........................ 2001-124260

(51) Int. Cl.[7] .......................................... H01L 21/4763
(52) U.S. Cl. ................................ 438/637; 438/724
(58) Field of Search ............................ 438/637–639, 438/724, 740, 744

(56) References Cited

U.S. PATENT DOCUMENTS 5,670,404 A * 9/1997 Dai ............................ 438/239
5,997,757 A 12/1999 Nagayama et al.
6,071,802 A 6/2000 Ban et al.
6,159,862 A 12/2000 Yamada et al.
6,352,921 B1 * 3/2002 Han et al. .................... 438/638

FOREIGN PATENT DOCUMENTS

JP         9-50986 A      2/1997
KR   2001-0020758 A      6/2001

* cited by examiner

Primary Examiner—David Nelms
Assistant Examiner—David Vu
(74) Attorney, Agent, or Firm—Sughrue Mion, PLLC

(57) ABSTRACT

A method for simply forming a miniature contact hole in a self-aligned manner with a wiring layer. A gate insulating film, a gate electrode, and a protective insulating layer are formed on the surface of a silicon substrate, and a blanket insulating film is deposited over the entire surface to cover a source/drain diffusion layer. Subsequently, an interlayer insulating film is laminated on the blanket insulating film. Nitrogen is added to a mixture gas of $C_5F_8$ and $O_2$, and the resulting mixture gas is excited by a plasma for use as an etching gas. The interlayer insulating film is etched by reactive ion etching (RIE) using the blanket insulating film as an etching stopper to form a contact hole. A silicon nitride film is preferably used for the protective insulating layer. A silicon nitride film or a silicon carbide film is preferably used for the blanket insulating film.

12 Claims, 9 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, to the structure of a contact hole which extends between wire layers in a multi-layer wiring structure of a semiconductor device, and a method of fabricating the contact hole structure.

2. Description of the Related Art

The trend of higher miniaturization and integration in semiconductor devices is still in vigorous advancement, and at present, super-high integrated semiconductor devices have been developed and made on an experimental basis, such as logic devices designed on the dimensional basis of approximately 0.15 μm, memory devices such as 1-gigabit dynamic random access memory (GbDRAM), and the like. However, such higher miniaturization in semiconductor devices makes it quite difficult to form contact holes which are essential in any structure of semiconductor devices.

Generally, a semiconductor device is manufactured by sequentially laminating patterns formed of a variety of materials such as a metal film, a semiconductor film, an insulating film and the like on a semiconductor substrate to complete the semiconductor device. The lamination of patterns for a semiconductor device involves a photolithographic process in which a mask is placed in registration with an underlying pattern, which has been formed in the previous process, and a next overlying pattern is aligned to and formed on the underlying pattern.

The alignment is similarly required in the formation of miniature contact holes. For example, in a structure comprised of a diffusion layer formed on the surface of a silicon substrate, and a pair of overlying wire patterns each of which constitutes a gate electrode of a MOS transistor, a contact hole must be formed through an interlayer insulating film such that the contact hole is positioned among the wire patterns of the gate electrodes and reaches a predetermined region in the diffusion layer.

In the formation of contact holes as mentioned above, the increasingly miniaturized dimensional basis makes the mask matching and alignment gradually more difficult. To solve this problem, a self-aligned contact (SAC) has been proposed since it can eliminate a design margin for alignment on a photomask. The SAC technology is now deemed indispensable for forming miniature contact holes, and such SAC technology has been used in practice.

When the SAC technology is relied on to form a contact hole, a silicon nitride (SiN) film is typically used as an etching stopper for an interlayer insulating film. A variety of techniques have been proposed for the formation of contact holes by the SAC technology, as represented by Laid-open Japanese Patent Application No. 9-050986 (JP, 09050986, A). In the following, a method of forming a contact hole described in JP, 09050986, A will be described with reference to FIGS. 1A to 1C.

First, as illustrated in FIG. 1A, gate insulating film 102 is formed on the surface of silicon substrate 101, and gate electrode 103 is formed on gate insulating film 102. Here, gate electrode 103 is designed in a so-called tungsten polyside structure as comprised of a tungsten silicide (WSi) layer and a polycrystalline silicon layer. Then, offset oxide film 104 is formed on gate electrode 103. Further, side wall insulating film 105 is formed on side walls of gate electrode 103 and offset oxide film 104. Here, offset oxide film 104 and side wall insulating film 105 are made of $SiO_x$ films, where the $SiO_x$ film is a silicon-based oxide film.

Source/drain diffusion layer 106 is formed in a LDD (lightly doped drain) structure, followed by lamination of SiN etching stopper film 107 and interlayer insulating film 108. Here, SiN etching stopper film 107 is a silicon nitride film of approximately 50 nm thick deposited by a low pressure (LP) CVD (chemical vapor deposition) method. On the other hand, interlayer insulating film 108 is an $SiO_x$ film.

Next, resist mask 109 is formed by photolithography, and interlayer insulating film 108 is selectively etched to form a contact hole 110, as illustrated in FIG. 1B. Here, SiN etching stopper film 107 functions as an etching stopper which completely protects offset oxide film 104 and side wall insulating film 105 from dry etching.

Next, changing an etching gas for use in the dry etching, SiN etching stopper film 107 is selectively etched away. In this manner, wire 111 is formed as illustrated in FIG. 1C. Specifically, wire 111 is connected to source/drain diffusion layer 106 through contact hole 110a formed through interlayer insulating film 108 and SiN etching stopper film 107. Here, wire 111 is a well known laminate wire layer.

As semiconductor devices are further miniaturized, the SAC technology is more frequently utilized, with the miniaturization in the SAC structure essentially accompanied thereto. Particularly, the SAC structure must be miniaturized more and more for forming a contact hole, by the SAC technology, for connecting a diffusion layer with a bit line in a memory cell comprised of one capacitor and one MOS transistor, as is the case with a memory device.

Next, the miniaturization of the SAC structure will be described with reference to FIGS. 2A to 2C.

As illustrated in FIG. 2A, gate insulating films 202, 202a are formed on the surface of silicon substrate 201, and gate electrodes 203, 203a are formed respectively on gate insulating films 202, 202a. Here, gate electrodes 203, 203a are in a so-called tungsten polyside structure as comprised of a WSi layer and a polycrystalline silicon layer. Then, protective insulating layers 204, 204a are formed on gate electrodes 203, 203a, respectively. Here, protective insulating layers 204, 204a are silicon nitride films. Then, source/drain diffusion layers 205, 205a are formed.

Next, as illustrated in FIG. 2B, blanket insulating film 206 is deposited over the entire surface. This blanket insulating film 206 is a silicon nitride film of approximately 30 nm thick, and is applied on the surfaces of gate electrodes 203, 203a, protective insulating layers 204, 204a, and source/drain diffusion layers 205, 205a. The structure in FIG. 2B largely differs from the example illustrated in FIGS. 1A to 1C in that no side wall insulating films are formed on side walls of the gate electrodes.

Next, as illustrated in FIG. 2C, interlayer insulating film 207 is laminated on blanket insulating film 206. Here, interlayer insulating film 207 is a silicon oxide film which has its surface planarized by a chemical mechanical polishing (CMP) method.

Next, a photoresist mask, not shown, is provided and used as an etching mask for dry-etching interlayer insulating film 207. In addition, a portion of underlying blanket insulating film 206 is selectively etched to form contact hole 208 which extends to the surface of source/drain diffusion layer 205.

Although not shown, subsequently, a wiring plug is formed in contact hole 208, and a bit line is disposed thereon for connection with the wiring plug. Thus, the SAC-based wiring structure is completed.

The inventor has investigated contact holes formed in a self-aligned manner with parallelly routed wire patterns, i.e., the SAC structure, as described above, from a variety of aspects including the miniaturization therefor. As a result, the inventor found that the method of forming the SAC structure in a miniaturized semiconductor device, as illustrated in FIGS. 2A to 2C, would deteriorate the insulating property in the contact hole. The reason will be discussed below with reference again to FIGS. 2A to 2C.

As illustrated in FIG. 2C, after forming contact hole 208 through the interlayer insulating film by dry etching, corner portions of protective insulating layers 204, 204a are sputter-etched on gate electrodes 203, 203a. Blanket insulating film 206 applied in contact hole 208 is also sputter-etched. Thus, corroded portions 209, 209a are formed in contact hole 208, as illustrated in FIG. 2C.

Generally, for dry-etching interlayer insulating film 207 made of a silicon oxide film, a reactive gas is excited by a plasma for use in the dry etching so as to reduce an etching rate for protective insulating layers 204, 204a and blanket insulating film 206 made of silicon nitride films. In other words, the etching gas is selected to provide a large ratio of the etching rate for silicon oxide film to the etching rate for silicon nitride film.

Here, the inventor found as a result of a variety of attempted experiments, that in the formation of the very small or miniature SAC structure as described above, ions within the plasma excited gas promoted the sputtering in the corner portions of protective insulating layers 204, 204a. Such a sputtering effect becomes more prominent as the aspect ratio, that is, ratio of the depth to the opening diameter, of contact hole 208 is higher. This sputtering effect causes a lower apparent ratio of the etching rate for silicon oxide film to the etching rate for silicon nitride film, resulting in corroded portions 209, 209a as mentioned above.

Such corroded portions 209, 209a, if any, cause short-circuiting between gate electrodes 203, 203a and the aforementioned bit line. Otherwise, the insulating property is degraded between these components. As a result, this causes a reduced manufacturing yield rate in mass production of semiconductor devices.

However, an attempt to reduce the corroded portions as mentioned above would require the SAC structure having side wall insulating films as described in connection with FIGS. 1A to 1C, thereby making the miniaturization difficult in the structure between gate wires. Eventually, difficulties in the miniaturization of the structure constitute a large bottle neck for higher integration and higher density for semiconductor devices such as memory devices.

SUMMARY OF THE INVENTION

It is an object of the present invention to provide a manufacturing method which is capable of readily forming a more miniaturized contact hole in a self-aligned manner with wires in a semiconductor device having a wiring structure.

It is another object of the present invention to provide a semiconductor device which has a miniaturized contact hole formed in a self-aligned manner with wires in a semiconductor device having a wiring structure.

It is a further object of the present invention to provide a semiconductor device manufacturing method which is capable of facilitating the formation of a self-aligned contact hole, and increasing the reliability of the contact hole, so that it can be applied to mass production of semiconductor devices.

According to a first aspect of the present invention, there is provided a method of manufacturing a semiconductor device, including the steps of covering an oxide film over a diffusion layer or underlying wires formed on a surface of a semiconductor substrate to form a first interlayer insulating film by the oxide film, forming a metal film and a first silicon nitride film laminated in this order on the first interlayer insulating film, processing the first silicon nitride film and the metal film into a wiring pattern to form overlying wires, depositing a second silicon nitride film over the entire surface such that the second silicon nitride film is applied on a top face and a side face of the first silicon nitride film processed into the wiring pattern, and side faces of the overlying wires, forming a second interlayer insulating film of an oxide film to cover the second silicon nitride film over the first interlayer insulating film, and forming an etching mask having a contact hole pattern on the second interlayer insulating film, penetrating the second interlayer insulating film by dry etching using the etching mask, and subsequently dry-etching the first interlayer insulating film using the first silicon nitride film processed into the wiring pattern and the second silicon nitride film as an etching mask to form a contact hole which reaches the diffusion layer or the underlying wires.

According to a second aspect of the present invention, there is provided a method of manufacturing a semiconductor device, including the steps of forming a metal film and a first silicon nitride film laminated in this order over a semiconductor substrate through an insulating film, processing the first silicon nitride film and the metal film into a wiring pattern to form wires, depositing a second silicon nitride film on the entire surface such that the second silicon nitride film is applied to a top face and a side face of the first silicon nitride film processed into the wiring pattern, and side faces of the wires, and forming a second silicon interlayer insulating film of an oxide film to cover the second nitride film, and forming an etching mask having a contact hole pattern on the second interlayer insulating film, penetrating the second interlayer insulating film by dry etching using the etching mask, and subsequently dry-etching the insulting film using the first silicon nitride film processed into the wiring pattern and the second silicon nitride film as an etching mask to form a contact hole which reaches the surface of the semiconductor substrate.

In the foregoing methods, a nitrogen containing gas is preferably added to fluorocarbon for use as an etching gas in at least one of the dry etching of the second interlayer insulating film or and the dry etching of the first interlayer insulating film. The fluorocarbon is preferably one or more kinds of gas selected from a group comprising $CF_4$, $CHF_3$, $CH_2F_2$, $CH_3F$, $C_4F_8$ and $C_5F_8$. The nitrogen containing gas is preferably one or more kinds of gas selected from a group comprising a nitrogen gas, an ammonia gas and a nitrous oxide gas.

With the foregoing techniques, it is possible to reduce the formation of a side wall protective film by a polymer in dry etching of the interlayer insulating films and moreover reduce the sputtering effect of the silicon nitride film. Thus, a favorable SAC structure can be realized even if a contact hole has a higher aspect ratio.

According to a third aspect of the present invention, there is provided a method of manufacturing a semiconductor device, including the steps of covering an oxide film over a diffusion layer or underlying wires formed on a surface of a semiconductor substrate to form a first interlayer insulating film by the oxide film, forming a metal film and a protective insulating layer made of silicon carbide or silicon nitride laminated in this order on the first interlayer insulating film, processing the protective insulating layer and the metal film into a wiring pattern to form overlying wires, depositing a silicon carbide film over the entire surface such that the silicon carbide film is applied on top faces and side faces of the protective insulating layer processed into the wiring pattern and the overlying wires, and forming a second interlayer insulating film of an oxide film to cover the silicon carbide film, and forming an etching mask having a contact hole pattern on the second interlayer insulating film, penetrating the second interlayer insulating film by dry etching using the etching mask, and subsequently dry-etching the first interlayer insulating film using the protective insulating layer processed into the wiring pattern and the silicon carbide film as an etching mask to form a contact hole which reaches the diffusion layer or the underlying wires.

According to a fourth aspect of the present invention, there is provided a method of manufacturing a semiconductor device, including the steps of forming a metal film and a protective insulating layer made of silicon carbide or silicon nitride laminated in this order over a semiconductor substrate through an insulating film, processing the protective insulating layer and the metal film into a wiring pattern to form wires, depositing a silicon carbide film on a top face and a side face of the protective insulating layer processed into the wiring pattern and side faces of the wires, forming a second interlayer insulating film of an oxide film to cover the silicon carbide film over the insulating film, and forming an etching mask having a contact hole pattern on the second interlayer insulating film, penetrating the second interlayer insulating film by dry etching using the etching mask, and subsequently dry-etching the insulting film using the protective insulating layer processed into the wiring pattern and the silicon carbide film as an etching mask to form a contact hole which reaches the surface of the semiconductor substrate.

In the foregoing methods, an oxygen gas is preferably added to fluorocarbon for use as an etching gas in at least one of the dry etching of the second interlayer insulating film and the dry etching of the first interlayer insulating film.

With the foregoing techniques, the silicon carbide film exhibits largely improved performance as an etching stopper in the dry etching of the interlayer insulating films. Thus, a favorable and high quality SAC structure can be realized even if a contact hole has a yet higher aspect ratio.

According to a fifth aspect of the present invention, there is provided a method of manufacturing a semiconductor device, including the steps of depositing a silicon oxide film and a silicon nitride film in lamination on a semiconductor substrate, and selectively dry-etching the silicon oxide film using the silicon nitride film as a mask for dry etching the silicon oxide film, and using an etching gas comprised of a fluorocarbon gas and a nitrogen containing gas added thereto. In this method, the fluorocarbon is preferably $C_4F_8$ or $C_5F_8$ in the etching gas, and nitrogen is preferably added at a dose of 80 volume % or more.

According to a sixth aspect of the present invention, there is provided a semiconductor device having a multi-layer wiring structure, including a pair of wires disposed over a semiconductor substrate through an insulating film, a protective insulating layer made of silicon carbide or silicon nitride, formed into a pattern shape of the wires on top faces of the wires, a blanket insulating film made of silicon carbide, formed on a top face and a side face of the protective insulating layer and on side faces of the wires, an interlayer insulating film formed to cover the blanket insulating film, and a contact hole extending through the interlayer insulating film, wherein the blanket insulating film remains on a side face of the contact hole.

In the respective aspects of the present invention described above, the interlayer insulating film preferably comprises a film selected from a group comprising a silicon oxide film, a silsesquioxane-based insulating film, and a silica film including at least one of an Si—H bond, an Si—$CH_3$ bond and Si—F bond.

Specifically, in the present invention, wires constituting a wiring structure of a semiconductor device are coated with an insulating material of a different type from the interlayer insulating film. Here, the wires may have portions in which those wires are disposed in parallel with one another and in which a contact hole is provided at an interval between those wires. Then, the insulating material is used as an etching stopper to form a SAC structure in the dry etching of the interlayer insulating films for forming a contact hole. According to the present invention as described, a margin region is eliminated for mask matching in a lithographic process, and a miniature SAC structure can be formed under high controllability. This significantly facilitates higher integration or higher density of semiconductor devices. In addition, a method of forming a contact hole according to the present invention can be readily applied to the mass production techniques for semiconductor devices. Further, this method of forming a contact hole can be simple and ensure a high yield rate in the manufacturing of semiconductor devices. When the present invention is applied to the manufacturing of DRAM (dynamic random access memory), memory cells are more largely reduced in size than when the prior art is applied. This effect becomes more prominent as the dimensional basis is smaller for the design of memory cells.

The above and other objects, features, and advantages of the present invention will become apparent from the following description with reference to the accompanying drawings which illustrate examples of the present invention.

DETAILED DESCRIPTION OF THE INVENTION

Next, a process of creating a self-aligned contact (SAC) hole in a first embodiment of the present invention will be described with reference to FIGS. 3A to 3C.

Figure 1A:
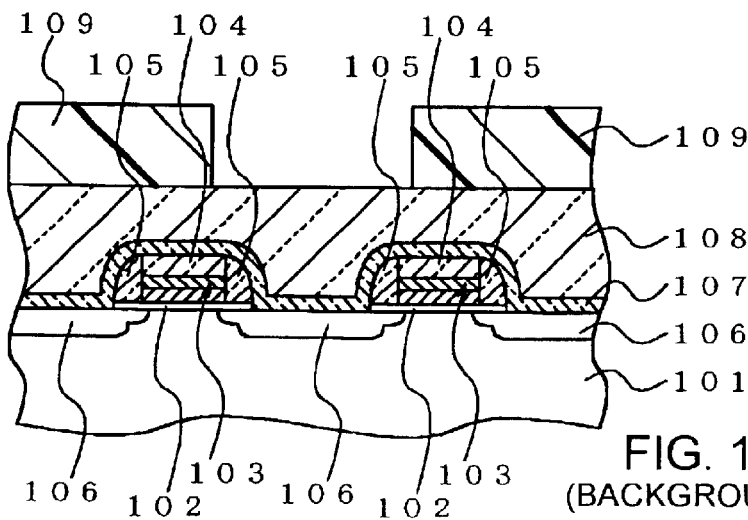
FIGS. 1A to 1C are cross-sectional views illustrating a conventional method of forming a SAC structure according to the process sequence.
Figure 1B:
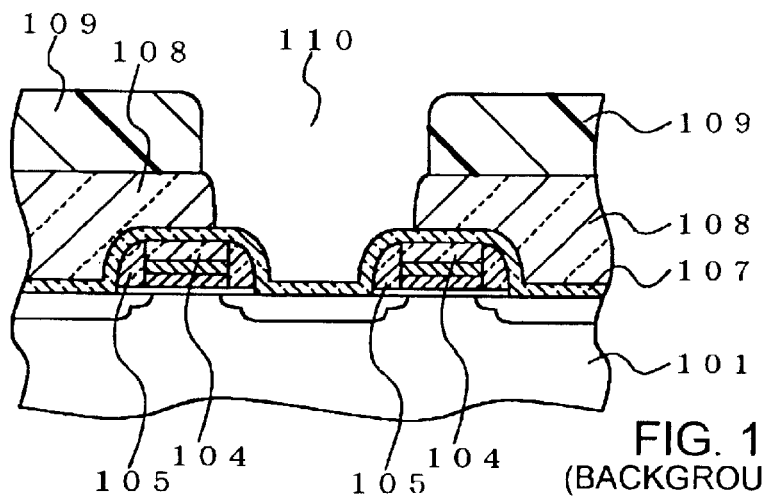
Figure 1C:
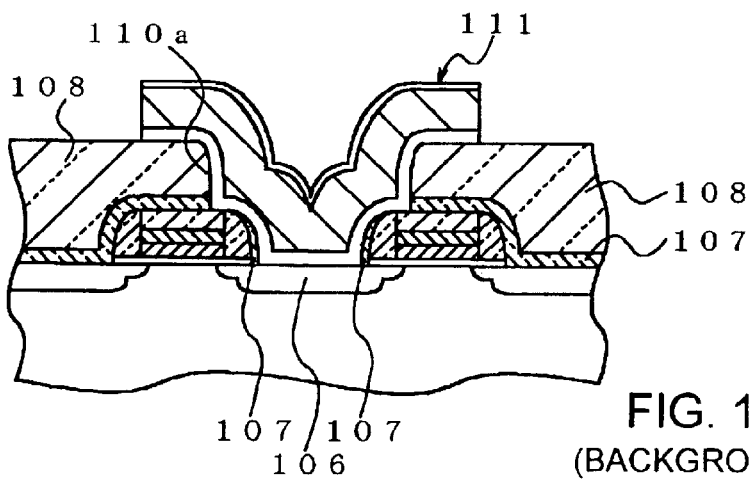
Figure 2A:
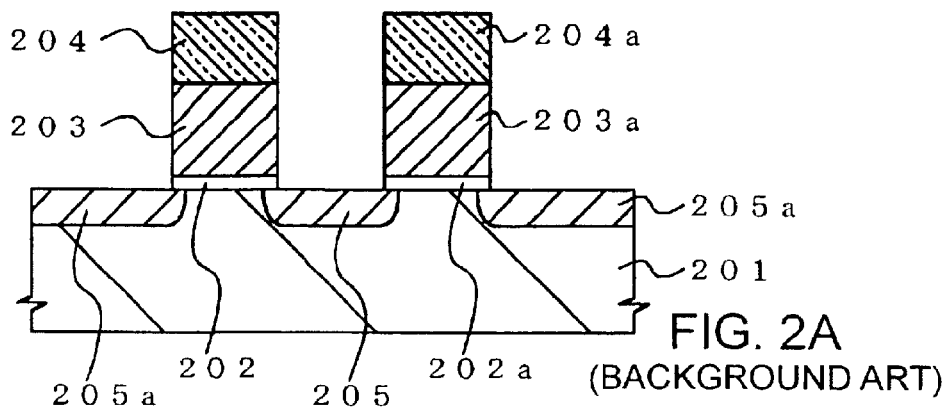
FIGS. 2A to 2C are cross-sectional views illustrating a conventional method of forming a miniaturized SAC structure according to the process sequence.
Figure 2B:
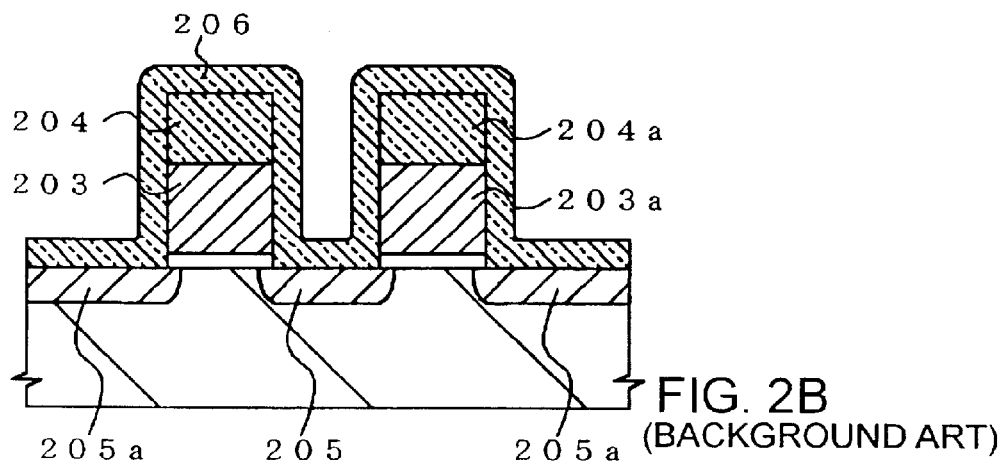
Figure 2C:
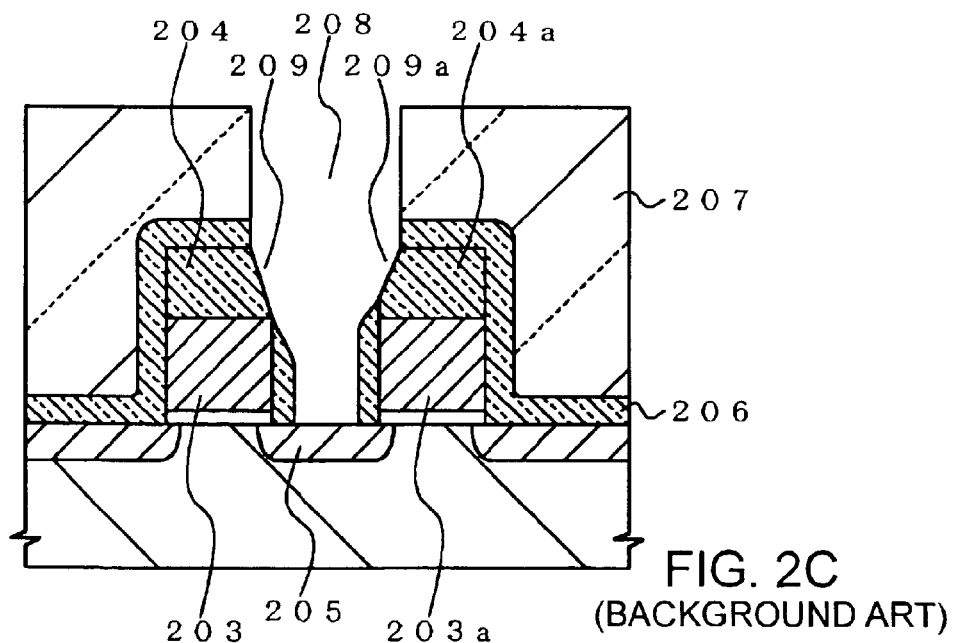
Figure 3A:
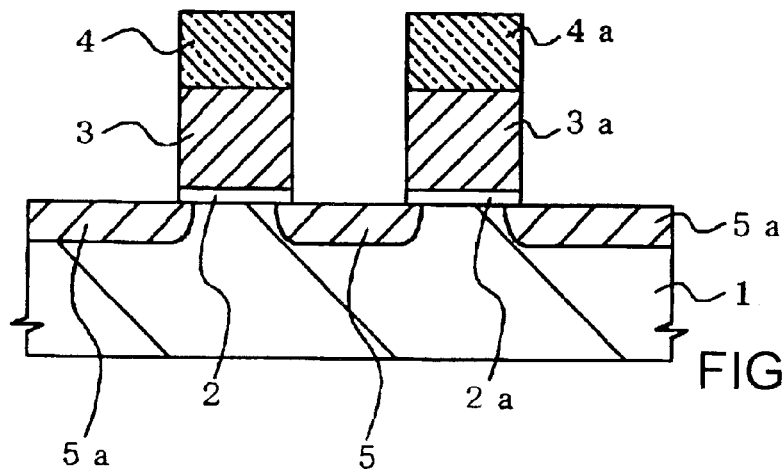
FIGS. 3A to 3C are cross-sectional views illustrating the formation of a SAC structure of a first embodiment of the present invention according to the process sequence.

As illustrated in FIG. 3A, gate insulating films 2, 2a made of silicon oxynitride films of approximately 4 nm thick are formed on the surface of silicon substrate 1, and gate electrodes 3, 3a are formed respectively on gate insulating films 2, 2a, in a manner similar to the counterparts described in connection with FIGS. 2A to 2C. Here, gate electrodes 3, 3a are in a so-called tungsten polyside structure as comprised of a WSi (tungsten silicide) layer and a polycrystalline silicon layer, which has a thickness and a pattern width of 150 nm, by way of example. Then, protective insulating layers 4, 4a are formed on gate electrodes 3, 3a, respectively. Here, protective insulating layers 4, 4a are first silicon nitride films of 100 nm thick. Then, source/drain diffusion layers 5, 5a are formed. Gate electrodes 3, 3a are spaced by 150 nm from each other.

Figure 3B:
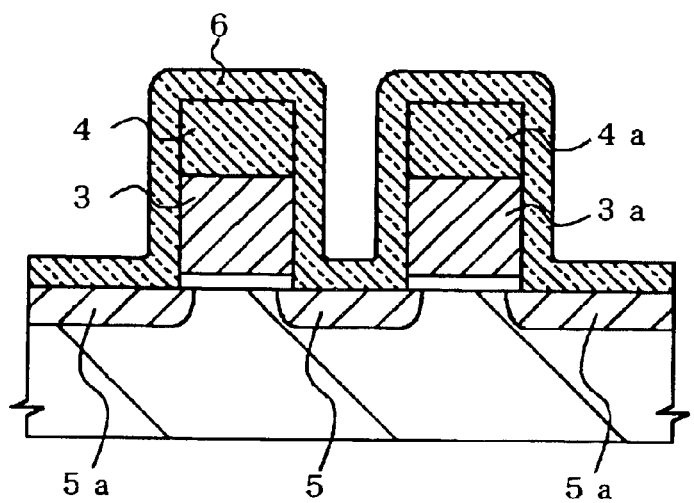

Next, as illustrated in FIG. 3B, blanket insulating film 6 is deposited over the entire surface by a thermal CVD method. Blanket insulating film 6 is a second silicon nitride film of approximately 30 nm thick, and is applied on the surfaces of gate electrodes 3, 3a, protective insulating layers 4, 4a, and source/drain diffusion layers 5, 5a.

The thermal CVD method is conducted at deposition temperatures ranging from 750° C. to 800° C., using a mixture gas of silane ($SiH_4$) and ammonia ($NH_3$) as a reactant gas for the deposition. Particularly, in this CVD process, the flow rate of $NH_3$ may be higher than the flow rate of $SiH_4$ gas. Specifically, the ratio of the $NH_3$ gas flow rate to the $SiH_4$ gas flow rate is chosen to be as high as on the order of 100. With such a large ratio, blanket insulating film 6 is applied conformally on the surfaces of gate electrodes 3, 3a, protective insulating layers 4, 4a, and source/drain diffusion layers 5, 5a. Here, as a deposition condition based on the thermal CVD, the total pressure of the reactant gases may be chosen to be, for example, as high as one quarter to one half of the atmospheric pressure, i.e., approximately $4 \times 10^4$ Pa, resulting in an improved step coverage and substantially the same thickness of the nitride film over the surfaces of gate electrodes 3, 3a, protective insulating layers 4, 4a, and source/drain diffusion layers 5, 5a. As appreciated, the deposition of the silicon nitride film in this embodiment involves a very high total gas pressure during reaction, as compared with a conventional low pressure CVD method for depositing a silicon nitride film. The value of total gas pressure is preferably in a range of $1 \times 10^4$ Pa to $6 \times 10^4$ Pa, according to investigations so far made.

Figure 3C:
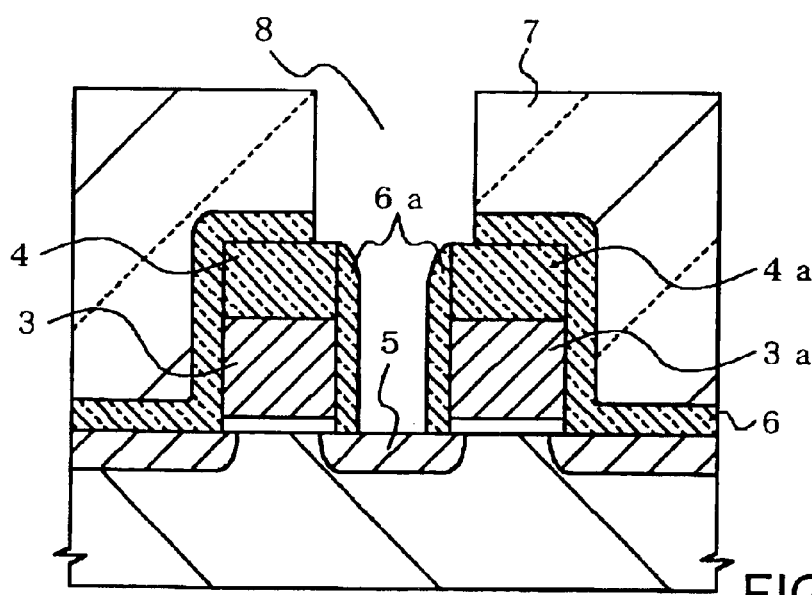

As illustrated in FIG. 3C, interlayer insulating film 7 is then laminated on blanket insulating film 6. Here, interlayer insulating film 7 is a silicon oxide film of approximately 700 nm thick, the surface of which is planarized by a CMP (chemical mechanical polishing) method.

Next, interlayer insulating film 7 is etched, using the photoresist mask as an etching mask, by RIE (reactive ion etching) which is a dry process. While RIE per se is a well known technology, the selection of an etching gas for use in the RIE process is quite critical in this embodiment. Therefore, etching conditions in the RIE process will be described with reference to FIG. 4 which shows the effect of adding a nitrogen ($N_2$) gas to a reactant gas for forming an SAC structure. In this embodiment, the dry etching is performed by RIE using RF (radio frequency) power at different two frequencies. Specifically, the etching gas is excited by a plasma with RF power at a frequency in a range of 13.56 MHz to 60 MHz, with other RF power at approximately 1 MHz superimposed thereon.

In the two-frequency RIE, nitrogen is added to a mixture gas of octafluorocyclopentene ($C_5F_8$) and oxygen ($O_2$) for use as the etching gas. Then, an argon (Ar) gas is further added to the resulting mixture gas which is used to excite a plasma. Such an etching gas causes a significant reduction in the etching rate for protective insulating layers 4, 4a or blanket insulating layer 6 underlying interlayer insulating film 7. In other words, the ratio of the etching rate for silicon nitride ($Si_3N_4$) film to the etching rate for silicon oxide ($SiO_2$) film can be reduced under high controllability.

Figure 4:
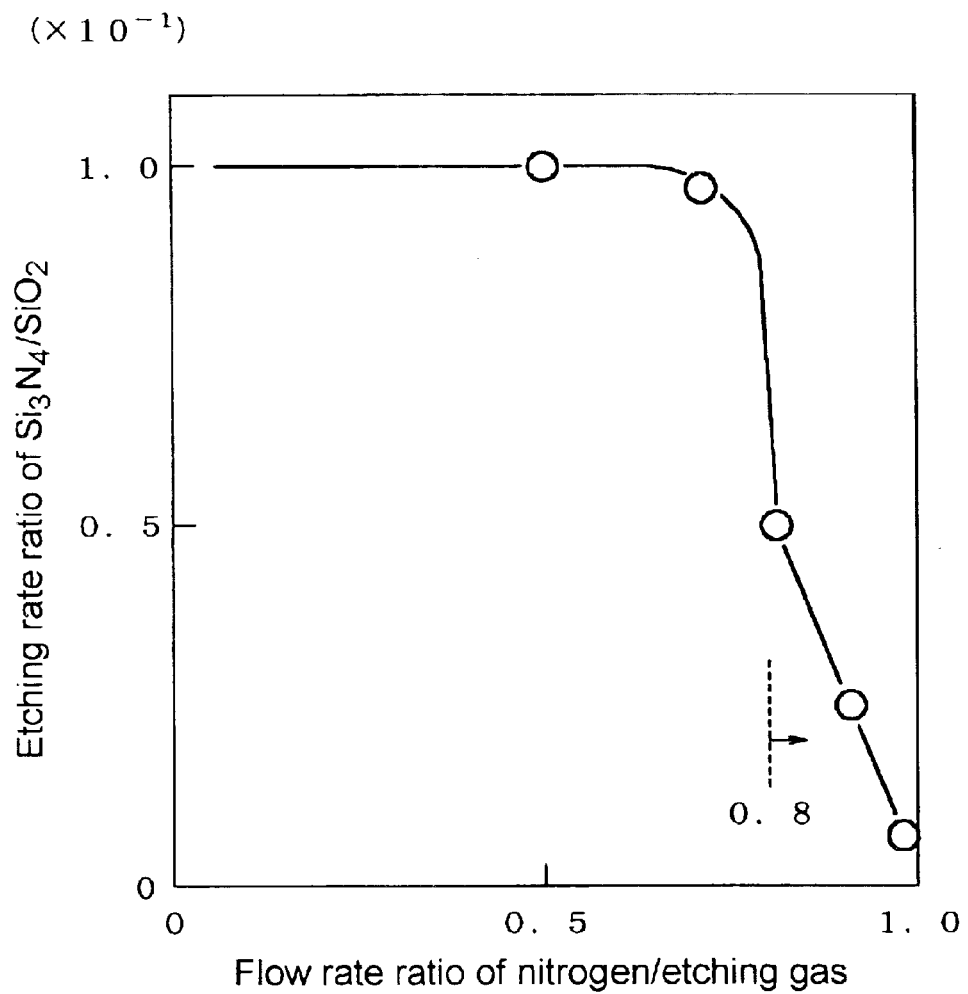
FIG. 4 is a graph showing the effect of an etching gas in an RIE (reactive ion etching) process for forming a SAC structure.

FIG. 4 represents on the horizontal axis the proportion of the $N_2$ gas added to the mixture gas of $C_5F_8$ and $O_2$. In this event, the total amount of the mixture gas of $C_5F_8$ and $O_2$ is maintained constant, while the proportion of the added $N_2$ gas is changed by the amount of Ar gas. FIG. 4 represents on the vertical axis the ratio of the etching rate for silicon nitride ($Si_3N_4$) film to the etching rate for silicon oxide ($SiO_2$) film. As can be seen from FIG. 4, the ratio of the etching rates abruptly decreases when the value of the $N_2$ gas amount/etching gas amount is 0.8 or more on the horizontal axis, and thus the selection ratio abruptly increases. In other words, the performance of the silicon nitride film is significantly improved as an etching stopper. A similar result as that shown in FIG. 4 was found when nitrogen was added to a mixture gas of octafluorocyclobutane ($C_4F_8$) and oxygen, as an etching gas, to which an argon gas was further added.

While the reason for such a phenomenon has not been clarified at present, it is deemed that the phenomenon occurs because the addition of nitrogen to the etching gas as mentioned above limits sputtering of corner portions of the protective insulating layer made of a silicon nitride film, or because the silicon nitride film is prevented from being etched by fluorine radicals within an excited plasma.

In this manner, blanket insulating film 6 or protective insulating layers 4, 4a are hardly etched in the RIE process for etching interlayer insulating film 7.

Subsequently, the two-frequency RIE is performed with the etching gas changed from the aforementioned mixture gas to a mixture gas of trifluoromethane ($CHF_3$) and carbon monoxide (CO), to remove blanket insulating film 6 on the bottom, causing the surface of diffusion layer 5 to expose. Thus, as illustrated in FIG. 3C, blanket insulating film 6a is left on side walls of gate electrodes 3, 3a and protective insulating layers 4, 4a. In this event, the thickness of remaining blanket insulating film 6a is approximately 25 nm. In this manner, contact hole 8, reaching the surface of diffusion layer 5, is formed as illustrated in FIG. 3C. Subsequently, although not shown, a plug is formed in contact hole 8, and a bit line is disposed thereon for connection to the plug. The depth and opening diameter of contact hole 8 in this event are 700 nm and 100 nm, respectively, so that its aspect ratio is approximately 7.

In this embodiment, the protective insulating layers and blanket insulating films formed around the gate electrodes function as sufficient etching masks in the RIE process for forming the contact hole. Then, the SAC structure is free from corrosion, which would otherwise occur therein, and the contact hole can be formed in a self-aligned manner with the gate electrode.

Figure 5A:
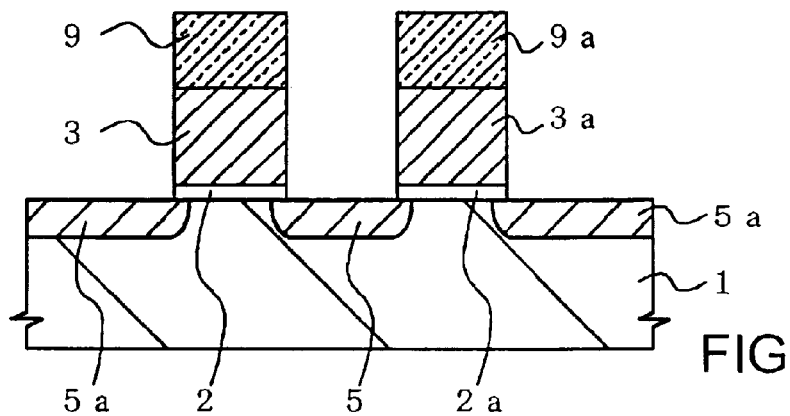
FIGS. 5A to 5C are cross-sectional views illustrating the formation of the SAC structure of a second embodiment of the present invention according to the process sequence.
Figure 5B:
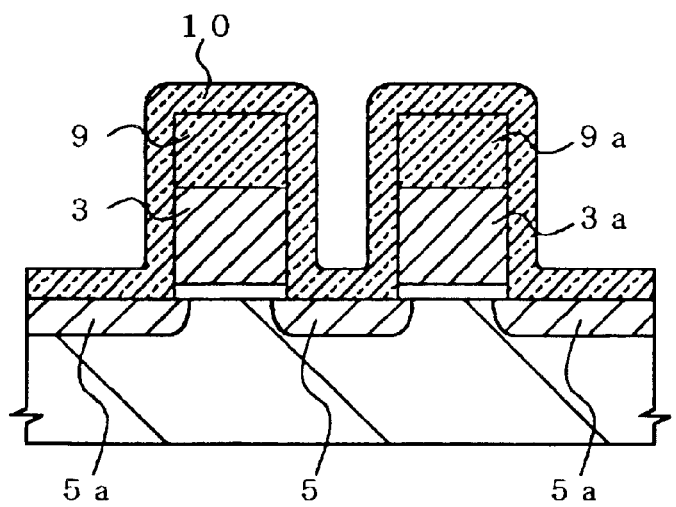
Figure 5C:
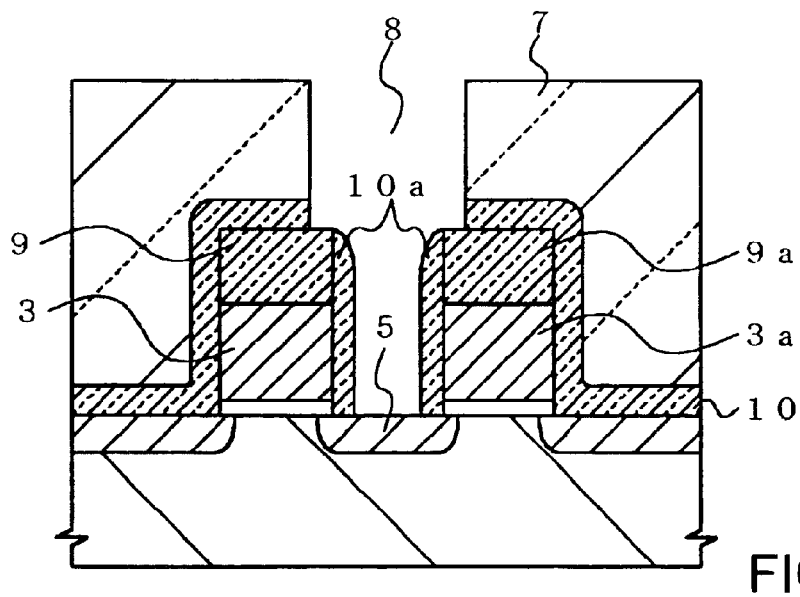

Next, a process of manufacturing a self-aligned contact hole in a second embodiment of the present invention will be described with reference to FIGS. 5A to 5C. In FIGS. 5A to 5C, components identical to those in FIGS. 3A to 3C are designated the same reference numerals.

Similarly, in the second embodiment as illustrated in FIG. 5A, gate insulating films 2, 2a and gate electrodes 3, 3a are also formed on the surface of silicon substrate 1, and protective insulating layers 9, 9a are formed respectively on gate electrodes 3, 3a. Here, protective insulating layers 9, 9a are first silicon carbide films of 100 nm thick. Then, source/drain diffusion layers 5, 5a are formed. Gate electrodes 3, 3a are spaced by 150 nm from each other. The silicon carbide films constituting protective insulating layers 9, 9a are deposited by a plasma CVD method using trimethylsilane ($SiH(CH_3)_3$) as a reactant gas. The silicon carbide film formed in this manner has the insulating property and a dielectric constant equal to 4.6 which is proximate to the dielectric constant of a silicon oxide film which is 4.0.

Next, as illustrated in FIG. 5B, blanket insulating film 10 is deposited over the entire surface by a thermal CVD method. Blanket insulating film 10 is a second silicon carbide film of approximately 30 nm thick, and is applied to the surfaces of gate electrodes 3, 3a, protective insulating layers 9, 9a, and source/drain diffusion layers 5, 5a. The thermal CVD method is conducted at deposition temperatures of approximately 750° C., using a mixture gas of trichlorosilane ($SiHCl_3$) and propane ($C_3H_8$) as a reactant gas for the deposition. Blanket insulating film 10, deposited by the thermal CVD under the foregoing conditions, is conformally applied to the surfaces of gate electrodes 3, 3a, protective insulating layers 9, 9a, and source/drain diffusion layers 5, 5a. Here, the silicon carbide film exhibits good step coverage, and blanket insulating film 10 has substantially the same thickness on side faces of gate electrodes 3, 3a, side faces and top faces of protective insulating layers 9, 9a, and surfaces of source/drain diffusion layers 5, 5a.

Subsequently, as illustrated in FIG. 5C, interlayer insulating film 7 is laminated on blanket insulating film 10. Interlayer insulating film 7 is then dry-etched using a photoresist mask as an etching mask. The dry etching in this event is based on the RIE using RF power at two frequencies, in a manner similar to that described in the first embodiment. In the second embodiment, a plasma is excited using a mixture gas of $C_5F_8$ and $O_2$, to which an argon gas is added, as an etching gas, in the two-frequency RIE. Such an etching gas provides a further reduction in the etching rate for protective insulating layers 9, 9a or blanket insulating film 10 underlying interlayer insulating film 7 than in the first embodiment. In other words, the ratio of the etching rate for silicon carbide (SiC) film to the etching rate for silicon oxide ($SiO_2$) film can be reduced under high controllability.

Figure 6:
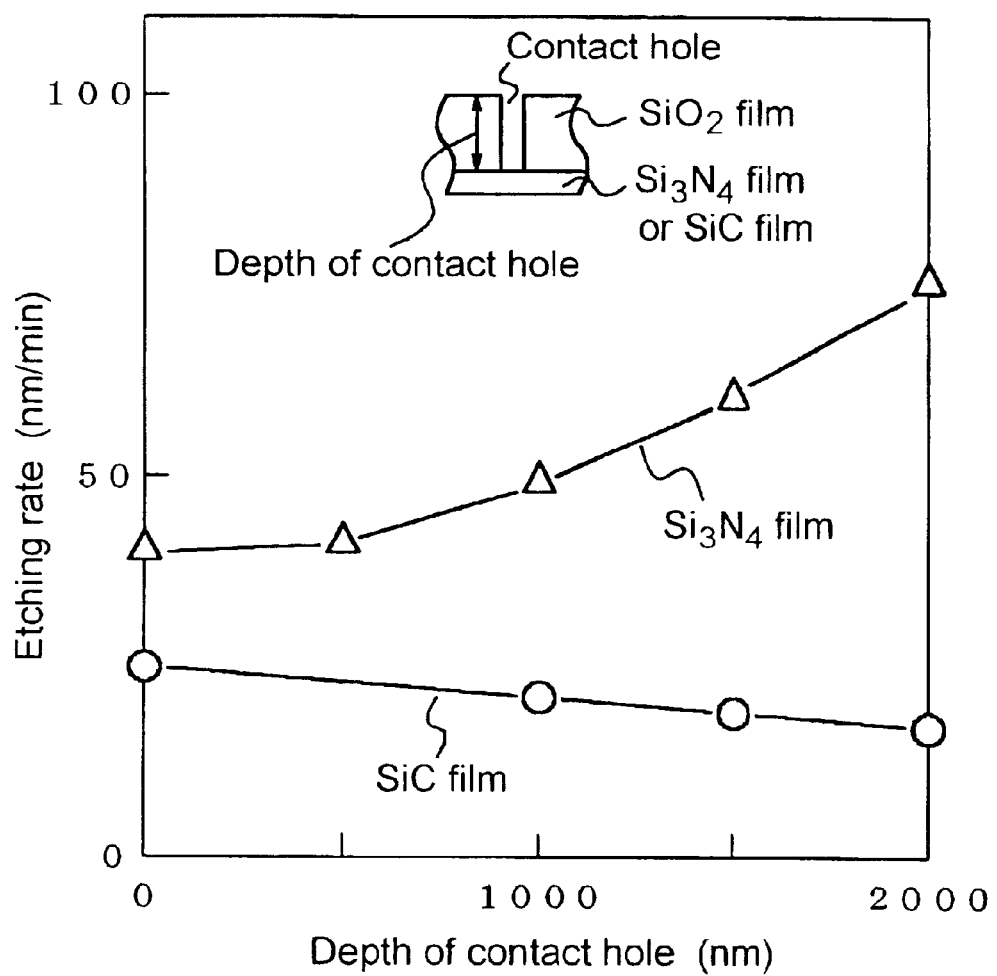
FIG. 6 is a graph showing the effect of an etching stopper in the second embodiment.

The foregoing reduction in the etching rate for protective insulating layers 9, 9a or blanket insulating layer 10 will be described with reference to FIG. 6. FIG. 6 is a graph illustrating the effect of an insulating material which is coated around a gate electrode, showing the result of an investigation made on the performance of a silicon nitride film or a silicon carbide film as an etching stopper when the silicon nitride film or silicon carbide film is laminated under a silicon oxide film, and the overlying silicon oxide film is dry-etched by RIE. FIG. 6 represents on the vertical axis an etching rate when a mixture gas of $C_5F_8$ and $O_2$, to which an argon gas is added, is excited by a plasma to dry etch the silicon oxide film, which functions as an interlayer insulating film, to form a contact hole, and the silicon nitride film or silicon carbide film is subsequently etched under the same etching conditions. FIG. 6 represents on the horizontal axis the depth of the contact hole. Here, the etching rate for silicon oxide film is 400 nm/min. In the graph, the depth of the contact hole equal to zero means that there is no silicon oxide film on the silicon nitride film or silicon carbide film.

As can be seen from FIG. 6, the silicon carbide film is etched at a rate of 25 nm/min so that its performance as an etching stopper is higher than a silicon nitride film which is etched at a rate of approximately 40 nm/min. In addition, the silicon nitride film is etched at a higher rate as the depth of a contact hole is larger. On the contrary, the silicon carbide film is etched at a lower rate as the depth of a contact hole is larger. In other words, according to the second embodiment, the effect of reducing the etching rate becomes more prominent as a semiconductor device is further miniaturized and a contact hole has a higher aspect ratio. In this manner, blanket insulating film 10 or protective insulating layers 9, 9a are prevented from being etched in the RIE process for etching interlayer insulating film 7.

Subsequently, the two-frequency RIE is performed, changing the etching gas to a mixture gas of $CHF_3$ and $N_2$, to remove blanket insulating film 10 on the bottom of the contact hole, causing the surface of diffusion layer 5 to expose. In this manner, blanket insulating film 10a is left on side walls of gate electrodes 3, 3a and protective insulating layers 9, 9a, as illustrated in FIG. 5C. Here, the thickness of remaining blanket insulating film 10a is approximately 30 nm. In this manner, contact hole 8 reaching the surface of diffusion layer 5 is formed as illustrated in FIG. 5C. Subsequently, although not shown, a plug is formed in contact hole 8, and a bit line is disposed thereon for connection to the plug. The depth and opening diameter of contact hole 8 in this event are 700 nm and 90 nm, respectively, so that its aspect ratio is approximately 8.

In the second embodiment, the protective insulating layers and blanket insulating film formed around the gate electrodes are formed of silicon carbide. This insulating film has very high performance as an etching stopper. This enables the formation of a miniature contact hole having a large aspect ratio, self-aligned to the gate electrodes, under a high reliability.

The foregoing embodiments have been described for the SAC-based formation of contact hole 8 which is positioned between a pair of gate electrodes 3, 3a, disposed in parallel, and reaches the surface of silicon substrate 1. Here, blanket insulating films 6, 10 may be formed to cover gate insulating film 2 which is left as a thin insulating film on source/drain diffusion layer 5. Alternatively, the gate insulating film on source/drain diffusion layer 5 may be removed, while another thin film is formed for use as an insulating film. In any case, the present invention can largely reduce the thickness of blanket insulating film 6, 10. This facilitates a reduction in the distance between gate electrodes 3, 3a, resulting in a significantly improved integration.

Next, a third embodiment of the present invention will be described with reference to FIGS. 7A to 7E. In the third embodiment, a contact hole is formed in a self-aligned manner with a wiring layer such as bit lines which are disposed in parallel.

Figure 7A:
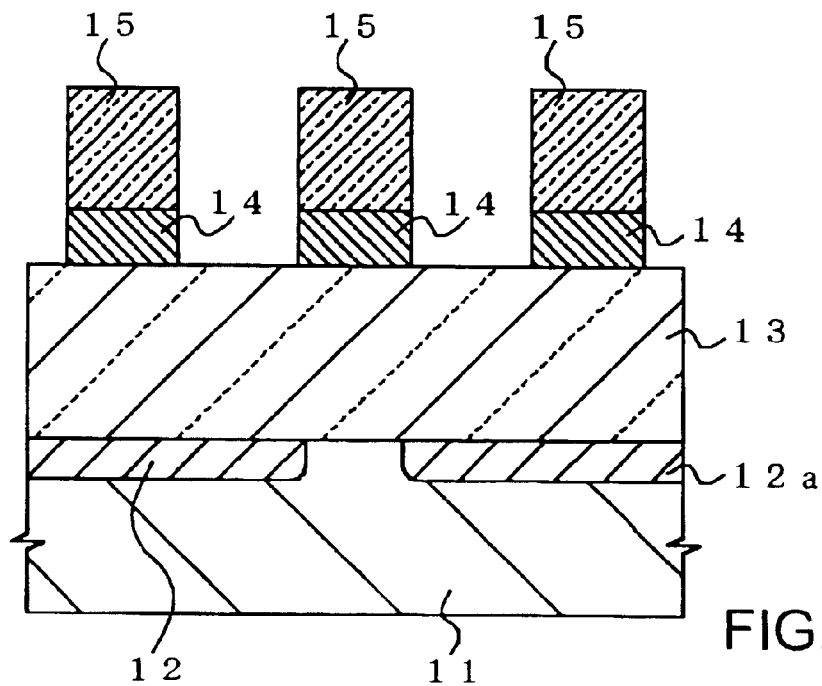
FIGS. 7A to 7E are cross-sectional views illustrating the formation of the SAC structure of a third embodiment of the present invention according to the process sequence.

As illustrated in FIG. 7A, diffusion layers 12, 12a of N-conductivity type are formed on the surface of silicon substrate 11 of P-conductivity type by ion implantation and thermal treatment. Then, first interlayer insulating film 13 is formed in thickness of approximately 500 nm. First interlayer insulating film 13 is fabricated by depositing a silicon oxide film by a plasma CVD method, and subsequently planarizing the silicon oxide film by a CMP method.

A tungsten (W) film or a laminate film comprised of W and tungsten nitride (WN) of 50 nm thick is deposited on planarized first interlayer insulating film 13 by a CVD method or a sputtering method. Then, a protective insulating layer is formed by a thermal CVD method. Here, the protective insulating layer is a silicon carbide film of 200 nm thick.

Subsequently, the protective insulating layer is processed by RIE using a photoresist mask as an etching mask. An etching gas used in the RIE process is a mixture gas of a tetrafluoromethane ($CF_4$) gas and a nitrogen gas which is excited by a plasma. Here, an ammonia ($NH_3$) gas may be used in place of the nitrogen gas. Difluoromethane ($CH_2F_2$), or a fluorocarbon gas such as $CHF_3$, $C_4F_8$, $CH_3F$ may be used in place of the $CF_4$ gas.

The metal film is then dry-etched by a plasma etching apparatus based on ICP (inductive coupled plasma) or microwave excited electron cyclotron resonance (ECR). This dry etching uses a reactant gas comprised of a mixture gas of sulfur hexafluoride ($SF_6$), nitrogen ($N_2$) and chlorine ($Cl_2$), and a $CF_4$ gas or a $C_4F_8$ gas added to the mixture gas. The use of such a reactant gas reduces the ratio of the etching rate for silicon carbide film to the etching rate for tungsten to approximately one fifth.

Consequently, first wires 14 in a wiring pattern and protective insulating layer 15 are formed in lamination as illustrated in FIG. 7A. Here, the wiring pattern has a pattern width and a pattern interval, both equal to 0.2 μm, by way of example.

Figure 7B:
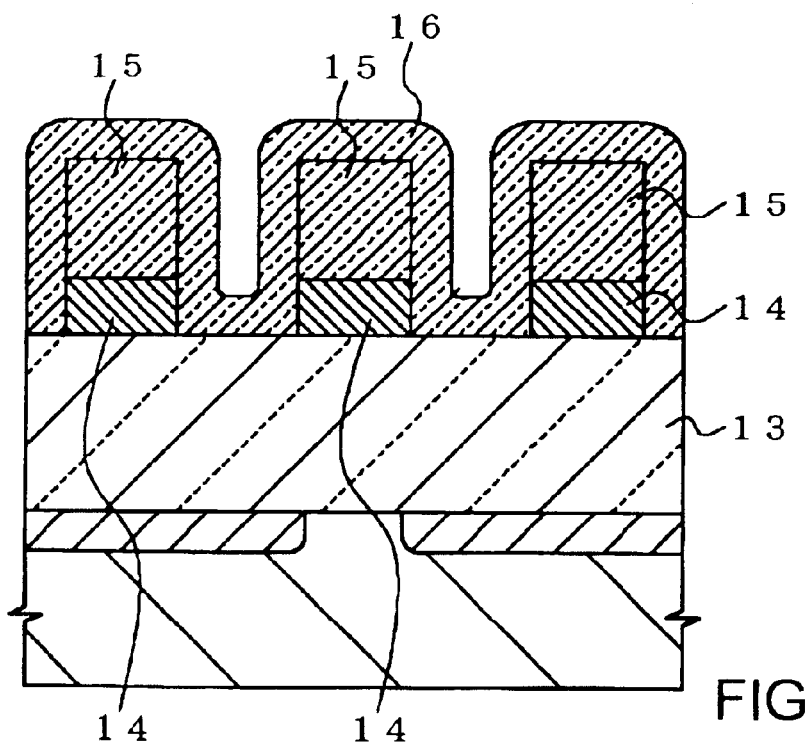

Next, as illustrated in FIG. 7B, a silicon carbide film is deposited by a thermal CVD method to form blanket insulating film 16 of approximately 70 nm thick on the surface of first interlayer insulating film 13, side faces of first wires 14, and surface of protective insulating layer 15. The thermal CVD method is conducted at deposition temperatures of approximately 750° C., using a mixture gas of $SiHCl_3$ and propane ($C_3H_8$) as a reactant gas for deposition. Blanket insulating film 16 is conformally applied to patterned first wires 14, protective insulating layer 15, and first interlayer insulating film 3, in a manner similar to that described in the second embodiment.

Figure 7C:
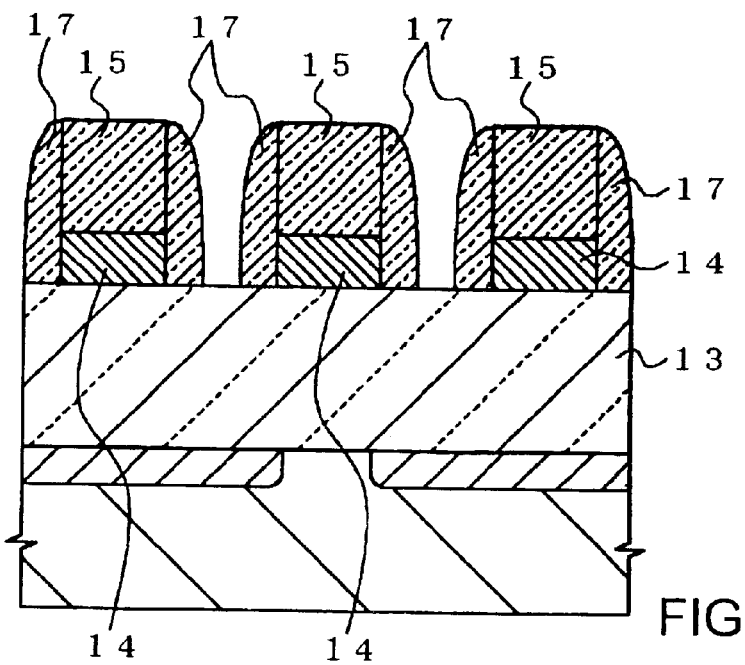

Blanket insulating film 16 is then entirely etched or etched back by anisotropic dry etching. In this manner, side wall insulating films 17 of approximately 50 nm thick are formed on side walls of first wires 14 and protective insulating layer 15, as illustrated in FIG. 7C. Here, a mixture gas of $NF_3$ and $N_2$ is excited by a plasma for use as an etching gas. Such an etching gas, when used, reduces the ratio of the etching rate for silicon oxide film to the etching rate for silicon carbide film, so that the surface of first interlayer insulating film 13 is substantially prevented from being etched in the etch back process. Side wall insulating films 17 function as protective insulating layers for first wires 14 together with protective insulating layer 15.

Figure 7D:
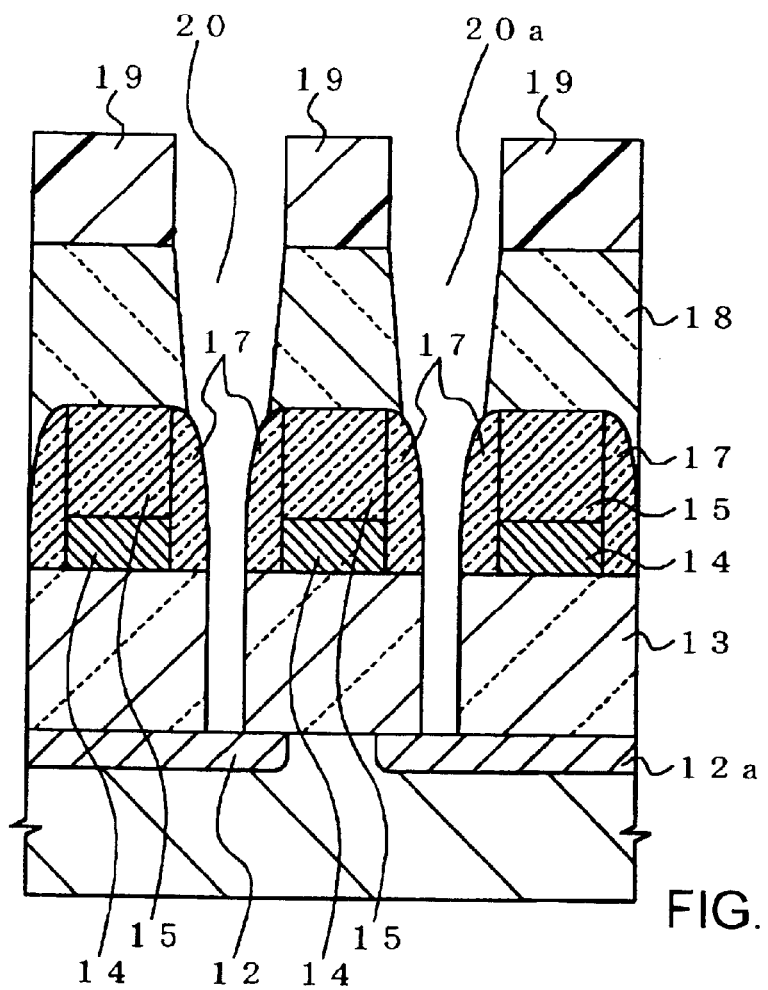

Next, as illustrated in FIG. 7D, second interlayer insulating film 18 is formed in a thickness of approximately 700 nm. Second interlayer insulating film 18 is fabricated by depositing a silicon oxide film by a CVD method, and subsequently planarizing the silicon oxide film by a CMP method. Then, resist mask 19 having a pattern of contact holes is formed by a lithographic technique, and second interlayer insulating film 18 and first interlayer insulating film 13 are sequentially dry-etched using resist mask 19 as an etching mask. In this manner, contact holes 20, 20a are formed as illustrated in FIG. 7D, where contact holes 20, 20a are located at intervals between first wires 14 adjacent to each other, penetrate the interlayer insulating films 13, 18 and reach the surfaces of diffusion layers 12, 12a. Here, protective insulating layer 15 and side wall insulating film 17 protect first wires 14 from being etched.

The dry etching for forming contact holes 20, 20a is based on RIE which uses RF power at two frequencies. Here, a plasma is excited with RF power at a frequency in a range of 13.56 MHz to 60 MHz, with other RF power at approximately 1 MHz superimposed thereon. In such two-frequency RIE, a mixture gas of $C_5H_8$, $O_2$ and Ar is excited by a plasma for use as an etching gas. Such an etching gas, when used, increases the ratio of the etching rate for silicon oxide film to the etching rate for silicon carbide film, so that side wall insulating film 17 or protective insulating layer 15 is substantially prevented from being etched in the RIE process. Then, side wall insulating film 17 also functions as an etching mask for first interlayer insulating film 13 in the RIE process for forming contact holes 20, 20a.

After resist mask 14 is removed by ashing using an oxygen plasma, the resulting structure is processed with diluted fluoric acid (DHF). In this processing, the structure is immersed in DHF for ten seconds to remove fluorine containing organic polymer or heavy metal contaminants which have been produced in the formation of contact holes 20, 20a.

Figure 7E:
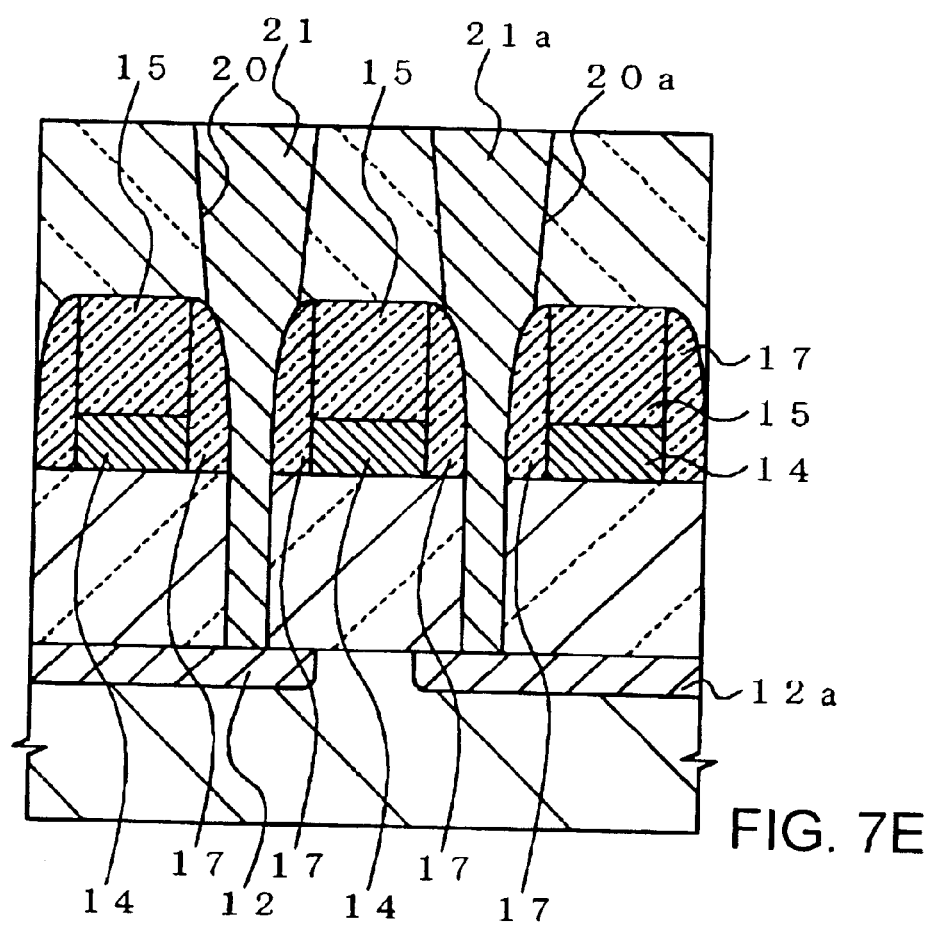

Next, as illustrated in FIG. 7E, contact plugs 21, 21a are filled in contact holes 20, 20a, respectively, which are formed in a self-aligned manner with first wires 14 surrounded by protective insulating layer 15 and side wall insulating film 17. Second wires are further formed for connection to contact plugs 20, 20a. Here, contact plugs 20, 20a are connected to diffusion layers 12, 12a, respectively. The depth and opening diameter of contact holes 20, 20a in this event are 1700 nm and 120 nm, respectively, so that their aspect ratio is approximately 15.

In the third embodiment, protective insulating layer 15 and side wall insulating film 17 formed around first wires 14 are used as an etching mask in the RIE for forming the contact holes. For this reason, first interlayer insulating film 13 can be formed with contact holes in a self-aligned manner with first wires 14. In addition, a favorable and high quality SAC structure can be provided even if contact holes have a higher aspect ratio.

In the foregoing manner, the SAC structure can be further miniaturized in a multi-layer wiring structure, thereby largely improving the integration of semiconductor devices.

While each of the foregoing embodiments has been described for wire layers which are formed of a tungsten film or a metal laminate film comprised of tungsten and tungsten nitride, the present invention is not limited to these materials. The present invention can be applied similarly to wire layers formed of a refractory metal such as molybdenum (Mo), tantalum (Ta), titanium (Ti) or the like, or a metal film such as platinum (Pt), ruthenium (Ru) or the like.

Also, the foregoing embodiments have been described for the formation of an interlayer insulating film using a silicon oxide film. The present invention, however, is not limited to this particular material for the interlayer insulating film. Alternatively, the interlayer insulating film may be formed of an insulating film made of a silsesquioxane group, or a silica film which includes at least one of an Si—H bond, an Si—$CH_3$ bond and an Si—F bond. Here, the insulating film made of a silsesquioxane group refers to an Si—O based dielectric film. Such an insulating film may be a low dielectric film such as hydrogen silsesquioxane, methyl silsesquioxane, methylated hydrogen silsesquioxane, or fluorinated silsesquioxane which belong to a silsesquioxane group.

Further, the interlayer insulating film may be formed of an organic insulating film which has a low dielectric constant. Such organic insulating film may include organic polysilazane, BCB (benzocyclobutane), polyimide, plasma CF polymer, plasma CH polymer, SiLK[R], Teflon AF[R], parylene N[R], parylene AF4[R], polynaphthalene N, and the like.

Also, for the protective insulating layer or blanket insulating film, a silicon oxynitride (SiON) film, or an alumina ($Al_2O_3$) film may be used in place of a silicon nitride film. Then, while the second and third embodiments have been descried for a silicon carbide film used as the protective film, a silicon nitride film may be used as the protective insulating layer.

As a fluorocarbon gas for use in the etching gas for the interlayer insulating film, $CF_4$, $CHF_3$, $CH_2F_2$, and $CH_3F$ may be used other than $C_4F_8$ or $C_5F_8$. In addition, as a nitrogen containing gas, an ammonia gas or a nitrous oxide ($N_2O$) gas may be used other than a nitrogen gas.

The effect of adding an $N_2$ gas to a mixture gas of $C_4F_8$ or $C_5F_8$ and $O_2$; shown in FIG. 4, is not limited to the formation of an SAC structure. Generally, a similar effect is produced as well when a silicon nitride film is used as an etching mask in dry etching for etching a silicon oxide film.

While preferred embodiments of the present invention have been described using specific terms, such description is for illustrative purposes only, and it is to be understood that changes and variations may be made without departing from the spirit or scope of the appended claims.

What is claimed is:

1. A method of manufacturing a semiconductor device, comprising:
    forming a metal film and a first silicon nitride film laminated in this order over a semiconductor substrate on an insulating film;
    processing said first silicon nitride film and said metal film into a wiring pattern to form wires;
    depositing a second silicon nitride film on the entire surface such that said second silicon nitride film is applied to a top face and a side face of said first silicon nitride film processed into said wiring pattern, and side faces of said wires, and over the semiconductor substrate between said wires;
    forming a silicon interlayer insulating film of an oxide film to cover said second silicon nitride film; and
    forming a contact hole which reaches a surface of said semiconductor substrate between wires of said wiring pattern, comprising:
        forming an etching mask having a contact hole pattern on said silicon interlayer insulating film;
        penetrating said silicon interlayer insulating film between the wires by dry etching using said etching mask; and
        subsequently removing said second silicon nitride film over said semiconductor substrate at a bottom of the contact hole by dry etching, using said first silicon nitride film processed into said wiring pattern and said second silicon nitride film on the top and side faces of said first silicon nitride film and the side faces of the wires as an etching mask,
    wherein at least the dry etching of said silicon interlayer insulating film is performed with a nitrogen-containing gas added to a reactant gas comprising a fluorocarbon gas, a ratio of nitrogen to the reactant gas being 0.8 or more.

2. A method according to claim 1, further comprising dry-etching said insulating film using said first silicon nitride film processed into said wiring pattern and said second silicon nitride film on the top and side faces of said first silicon nitride film and the side faces of the wires as an etching mask, wherein a nitrogen containing gas is added to a fluorocarbon gas for use as an etching gas in the dry etching of said insulating film.

3. A method according to claim 1, wherein said fluorocarbon gas is one or more kinds of gas selected from a group consisting of $CF_4$, $CHF_3$, $CH_2F_2$, $CH_3F$, $C_4F_8$ and $C_5F_8$.

4. A method according to claim 3, wherein between the steps of penetrating said silicon interlayer insulating film by dry etching and subsequently removing said second silicon nitride film at the bottom of the contact hole, a step is performed of changing to a different etching gas, the dry-etching of said second silicon nitride film being performed with said different etching gas.

5. A method according to claim 3, wherein said different etching gas comprises a mixture of $CHF_3$ and CO.

6. A method according to claim 3, wherein said reactant gas further comprises $O_2$.

7. A method according to claim 6, wherein the dry etching of said silicon interlayer insulating film is reactive ion etching performed using two radio frequencies, and argon gas is further included with said nitrogen-containing gas and said reactant gas.

8. A method according to claim 1, wherein said nitrogen-containing gas is one or more kinds of gas selected from a group consisting of a nitrogen gas, an ammonia gas and a nitrous oxide gas.

9. A method according to claim 1, wherein said wires are formed such that said wires run in parallel with one another.

10. A method according to claim 1, wherein between the steps of penetrating said silicon interlayer insulating film by dry etching and subsequently removing said second silicon nitride film at the bottom of the contact hole, a step is performed of changing to a different etching gas, the dry-etching of said second silicon nitride film being performed with said different etching gas.

11. A method according to claim 1, wherein said depositing the second silicon nitride film is conformal.

12. A method according to claim 1, wherein said depositing the second silicon nitride film is performed by chemical vapor deposition with a total gas pressure in a range of $1 \times 10^4$ Pa to $6 \times 10^4$ Pa.

* * * * *